(12) United States Patent
Chou et al.

(10) Patent No.: US 6,204,576 B1
(45) Date of Patent: Mar. 20, 2001

(54) HIGH-VOLTAGE SWITCH CIRCUIT

(75) Inventors: Yung-Fa Chou, Kaohsiung; Yue-Der Chih, Hsinchu, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/100,929

(22) Filed: Jun. 22, 1998

(51) Int. Cl.[7] .................................................. H01H 83/00
(52) U.S. Cl. ............................................................ 307/125
(58) Field of Search ............................ 307/125; 327/390, 327/327, 328

(56) References Cited

U.S. PATENT DOCUMENTS

| | | | |
|---|---|---|---|
| 5,811,990 | * 9/1998 | Blodgett et al. | 326/81 |
| 5,905,402 | * 5/1999 | Kim et al. | 327/536 |
| 5,930,175 | * 7/1999 | Lakhani et al. | 365/185.33 |
| 5,978,283 | * 11/1999 | Hsu et al. | 365/189.09 |

* cited by examiner

Primary Examiner—Josie A. Ballato
Assistant Examiner—Robert L. DeBeradinis
(74) Attorney, Agent, or Firm—Nath & Associates; Harold L. Novick

(57) ABSTRACT

A high-voltage switch circuit is disclosed, which includes at least one voltage source input terminal for providing at least one voltage source (HV1), and a passing circuit (T0) for controllably passing the voltage source. The present invention also includes a pumping circuit (202) for raising voltage level of one output terminal (C) thereof. At least one switch circuit (T6 or T7) under control of a switch signal is used so that the voltage source controllably propagates to one output terminal (OUT1, OUT2) of the switch circuit through the passing circuit. Finally, a circuit (T4) is used for forcing the output terminal of the pumping circuit and one internal node (A) of the pumping circuit to an equal potential, so that the voltage source propagates to the output terminal of the switch circuit through the forcing circuit when the output terminal of the switch circuit is coupled to a ground.

11 Claims, 4 Drawing Sheets

HIGH-VOLTAGE SWITCH CIRCUIT

BACKGROUND OF THE INVENTION

1. Field of the Invention

The present invention relates to a switch circuit, and particularly to a discharge circuit for a high-voltage switch circuit.

2. Description of the Prior Art

A high-voltage switch circuit is conventionally used in programmable integrated circuits, such as flash memory devices, for propagating a high voltage to word lines or source lines in order to perform programming or erasing function. FIG. 1 shows a schematic diagram illustrating a typical high-voltage switch circuit 10 conventionally used in flash memory devices. Switch signals SW1 and SW2 are generally global signals, which are used to control switch transistors N6 and N7, respectively, along with other similar transistors, for example, of the same row of the flash memory cell array. Generally, the switch signal SW1 is the inverse of the other switch signal SW2. In this diagram, the output terminals of the switch transistors N6 and N7, designated as OUT1 and OUT2 are coupled to a source line or a word line (not shown). Under the control of the switch transistors N6 and N7 with the signals SW1 and SW2, a high voltage source HV1, which is a global high voltage source generated by a pumping circuit (not shown), can be propagated to the output terminal OUT1 or OUT2. In order to effectively transmit the high voltage HV1 to node D, a local pumping circuit 102 is used to pump (or raise) the voltage level at node C. A two-stage cascade pumping circuit 102 such as that shown in FIG. 1 is usually used, in which clock signal pair of CLK and CLKn (inverted CLK) is provided as a pumping clock pair.

During circuit operation, considering the switch signal SW1 being, at high voltage level and the output terminal OUT1 being connected to the ground, there is a discharge path from node A through nodes B, C and D to the ground. The situation mentioned above is usually referred to as being unselected, compared to a selected situation wherein the voltage potential at the output terminal OUT1 is high. Concerning the unselected situation, the nodes A, B, and C will not be pumped to high voltage. Further, with the transistors N5 and N6, the voltage of the node C will remain zero no matter how the clock CLKn changes. It is worth noting that the passing gate N0 in the switch circuit 10 will not conduct be cause of the zero voltage at the node C, therefore prohibiting the high voltage HV1 from propagating to the output terminal OUT1.

Accordingly, the node A becomes almost floating, and therefore the voltage level of the node A will unwontedly vary with the change of the clock CLK. More specifically, when the clock CLK rises, the node A will be coupled through the capacitor K1, and the voltage at the node A rises a little above zero; when the clock CLK falls, the node A will also be coupled through the capacitor K1, and the voltage at the node A then falls a little below zero. A simulation result of the high voltage sources HV1 and HV2 is shown in FIG. 2. Due to the fact that the node C remains zero as discussed above, the negative voltage at the node A will weakly turn on the transistor N1, thereby sinking some current from another high voltage source HV2 and affecting its pumping circuit (not shown). As the number of the memory cells and their corresponding switch circuits is more than hundreds of thousand, the total sum of these sink currents becomes significant and intolerable, thereby degrading the pumping efficiency of the pumping circuit of the high voltage source HV2, or even failing the programming and erasing function in the flash memory devices. Therefore, a need has been arisen to provide a scheme for overcoming these deficiencies.

SUMMARY OF THE INVENTION

In accordance with the present invention, a high-voltage switch circuit is provided so that the undesired swing of high-voltage source and the substantial current sinking therefrom can be reduced, thereby increasing the efficiency of the pumping circuit of the high-voltage sources. In one embodiment, the present invention includes at least one voltage source input terminal for providing at least one voltage source, and a passing circuit configured to controllably pass the voltage source. Further, the present invention also includes a multi-stage cascade pumping circuit configured to raise voltage level of one output terminal thereof by at least a pair of clock signals inputting to the multi-stage cascade pumping circuit. At least one switch circuit under control of a switch signal is used so that the voltage source controllably propagates to one output terminal of the switch circuit through the passing circuit, wherein the output terminal of the switch circuit is coupled to a word line or a source line of a flash memory device. Finally, an equalizing circuit is configured to force the output terminal of the multi-stage cascade pumping circuit and one internal node of the multi-stage cascade pumping circuit to an equal potential, so that the voltage source propagates to the output terminal of the switch circuit through the equalizing circuit when the output terminal of the switch circuit is coupled to a ground.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 3:
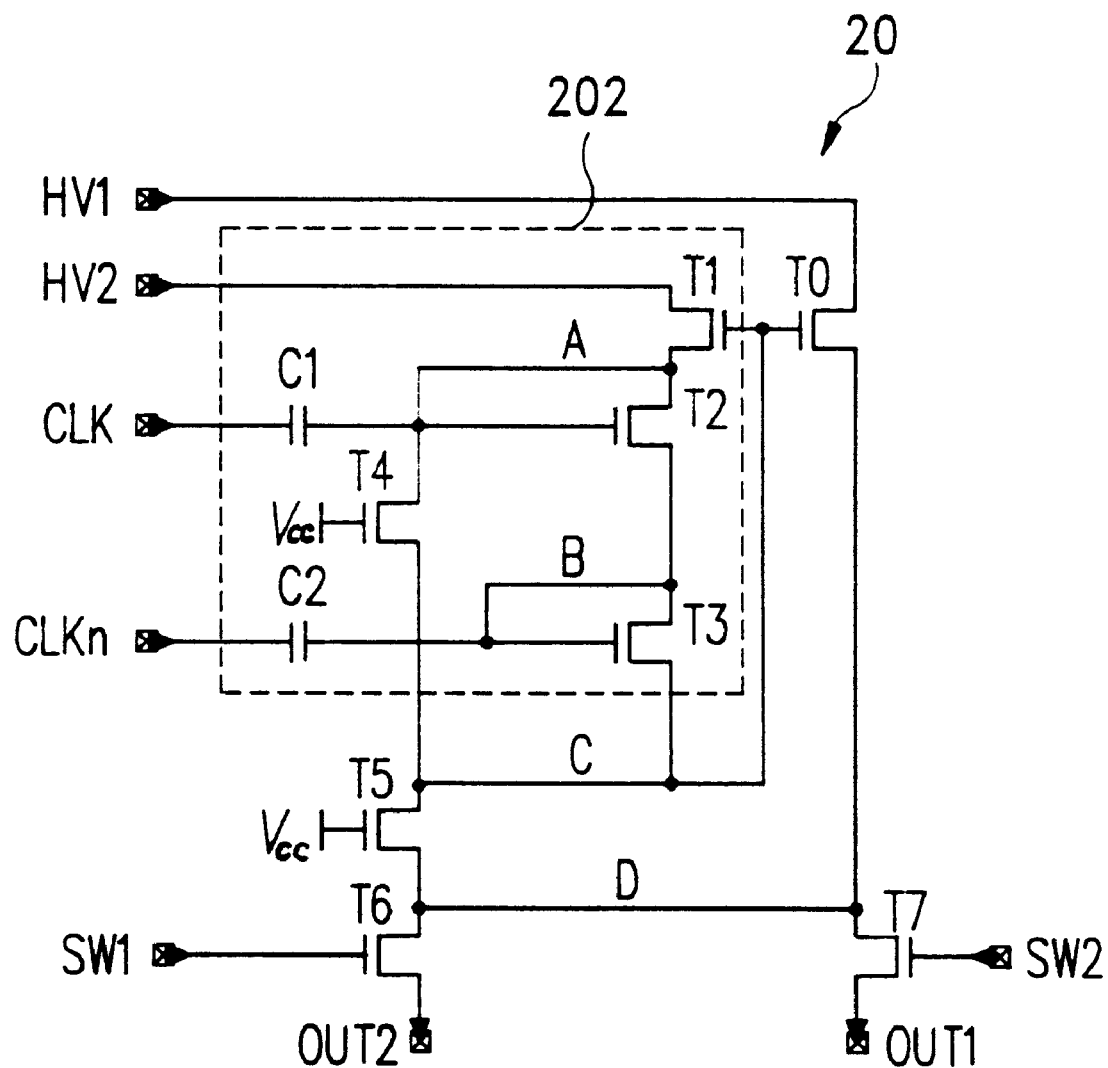
FIG. 3 shows a schematic diagram illustrating a high-voltage switch circuit according to one embodiment of the present invention.

FIG. 3 shows a schematic diagram illustrating a high-voltage switch circuit 20 according to one embodiment of the present invention, wherein the switch circuit 20 is used for the purpose of performing programming or erasing in flash memory devices according to the embodiment. In this circuit 20, there are two high voltage sources HV1 and HV2, which are generally global high voltage sources generated by a pumping circuit (not shown). It is appreciated that the number of the high voltage sources can vary, and that the high voltage source HV1 can be the same as the high voltage source HV2. In this embodiment, a voltage of about 13 volts is provided for the purpose of programming, and a voltage of about 14 volts is provided for the purpose of data erasing.

Still referring to this figure, the high voltage source HV1 is coupled to a passing gate (or transistor) T0, and the other high voltage source is connected to a local pumping circuit 202, which is used to pump (or raise) the voltage level on its output node C, and will be detailed later.

Switch signals SW1 and SW2 are generally global signals, which are used to control switch transistors T6 and T7, respectively, along with other similar transistors, for example, of the same row of the flash memory cell array. In this embodiment, the switch signal SW1 is the inverse of the other switch signal SW2. Further, the output terminals of the switch transistors T6 and T7, designated as OUT1 and OUT2 are coupled to a source line or a word line (not shown). Under the control of the switch transistors T6 and T7 with the controlling signals SW1 and SW2, the high voltage source HV1 propagates to the output terminal OUT1 or OUT2.

During the operation of the circuit 20, supposing that the switch signal SW1 is at high voltage level and the output terminal is coupled to the ground, there is a discharge path from node A through nodes B, C and D to the ground, which is usually referred to as an unselected mode, contrary to a selected mode wherein the voltage potential at the output terminal OUT1 is high. For the unselected mode, the nodes A, B and C will not be pumped to high voltage. Moreover, with the transistor T5 and T6, the voltage at the node C remains zero no matter how the clock CLKn changes. Consequently, the passing gate T0 will not conduct because of the zero voltage at the node C, thereby prohibiting the high voltage HV1 from propagating to the output terminal OUT1 or OUT2.

Figure 1:
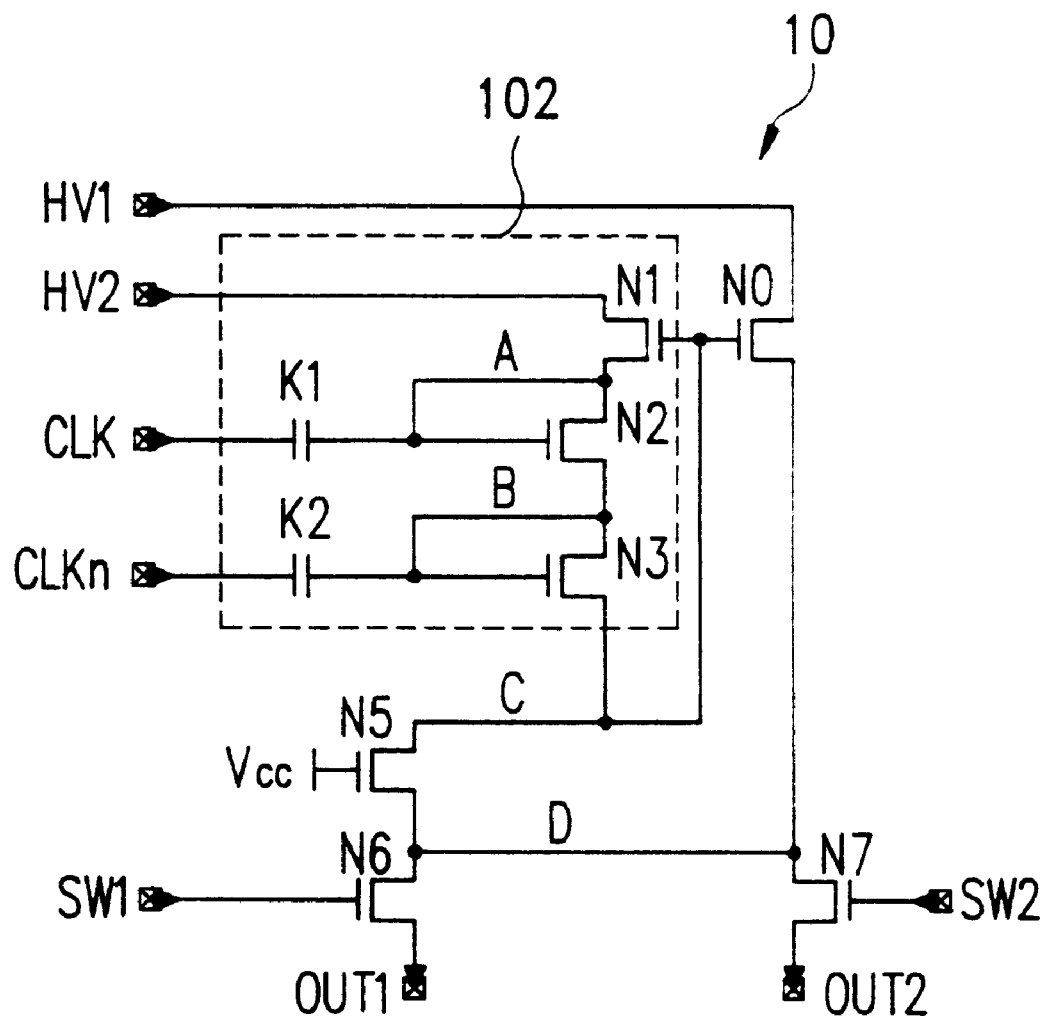
FIG.1 shows a schematic diagram illustrating a typical high-voltage switch circuit conventionally used in flash memory devices.
Figure 2:
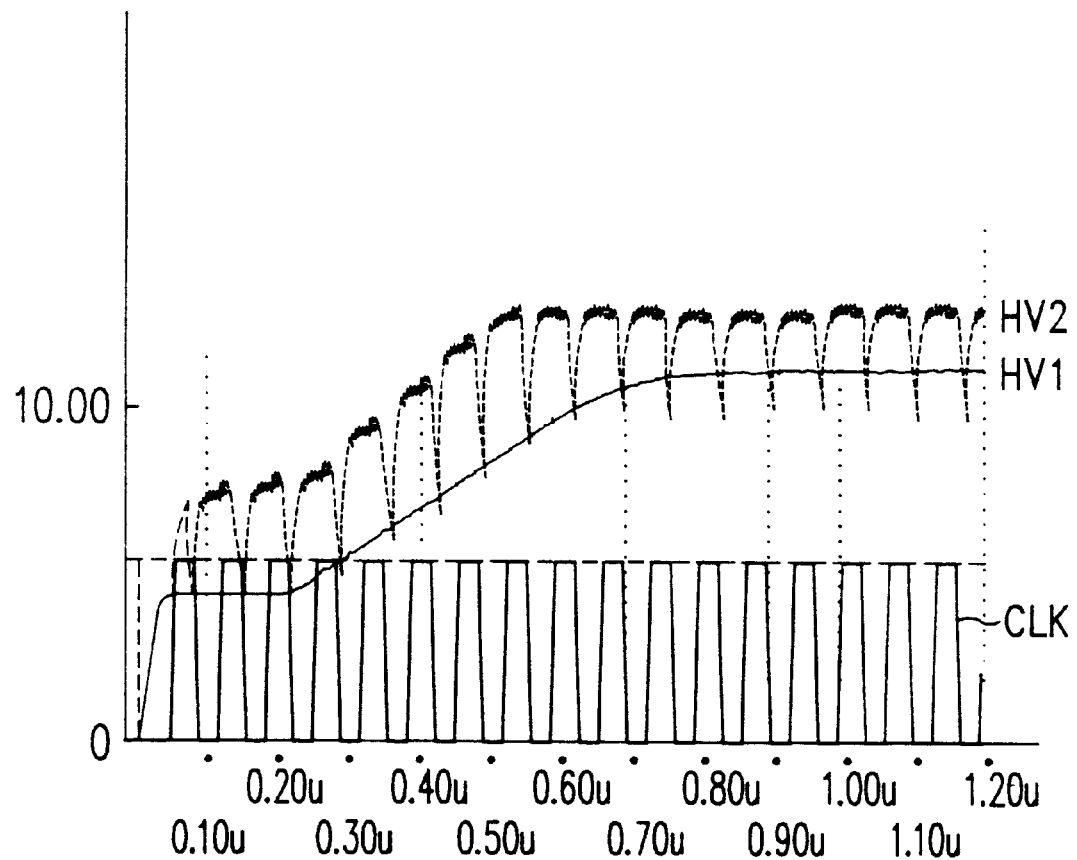
FIG. 2 shows a simulation result of the high voltage sources HV1 and HV2.
Figure 4:
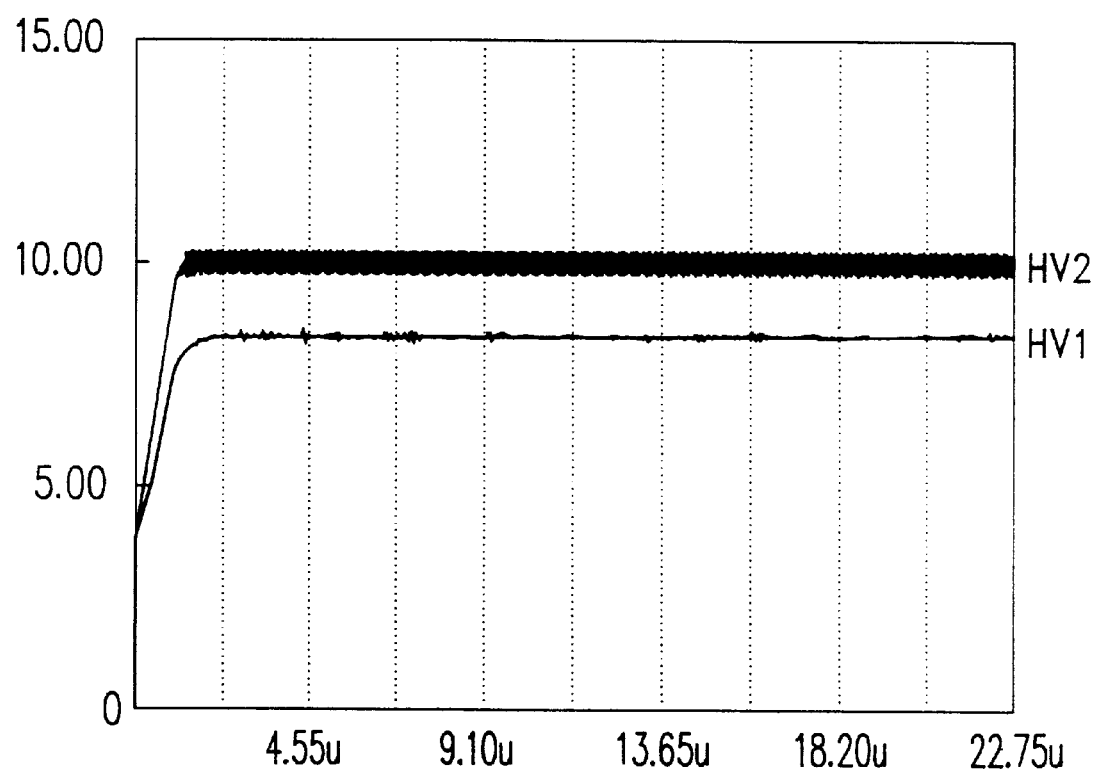
FIG. 4 show a graph illustrating one simulation result of the high voltage sources HV1 and HV2 according to the present invention.

More specifically referring to the local pumping circuit 202, in this embodiment, the local pumping circuit 202 includes a two-stage cascade pumping circuit, which consists of capacitors C1, C2 and transistors T2, T3. The local pumping circuit 202 is activated by a clock signal pair of CLK and CLKn (inverted CLK); consequently, when the clock CLK rises, the node A will be coupled through the capacitor C1, and when the clock CLK falls, the node A will also be coupled through the capacitor C1. It is particularly noted that the fluctuation at the node A in the conventional switch circuit, such as the high-voltage switch circuit shown in FIG. 1, no longer exists. In other words, the node A will remain zero no matter how the clock CLK changes, because there is a direct discharge path from the node A through the transistors T4 (which acts as a means to force the node A and the node C to an equal potential), T5 and T6 to the ground. Consequently, the transistor T1 does not conduct unwantedly, and the undesired swing of high voltage source HV2 and the substantial current sinking therefrom can be reduced, thereby increasing the efficiency of the pumping circuit (now shown) of the high-voltage sources HV1 and HV2. It is appreciated that although single transistor T4 is used in this embodiment, the configuration and the number of the transistors which are used to equalize the node A and the node C can vary. FIG. 4 show a graph illustrating one simulation result of the high voltage sources HV1 and HV2 according to the present invention.

Although the node B is almost floating and its voltage fluctuate with the change of the clock CLKn, the zero voltage of the nodes A and C will, however, limit the swing range caused by the clock CLKn. Practically, the swing at the node B is too small to falsely turn on the transistor T2 or T3; therefore there is no current sinking from the high voltage source, and this swing is negligible.

Although specific embodiments have been illustrated and described, it will be obvious to those skilled in the art that various modifications may be made without departing from the spirit which is intended to be limited solely by the appended claims.

What is claimed is:

1. A high-voltage switch circuit, comprising:
   at least one voltage source input terminal for providing at least one voltage source;
   passing means for controllably passing said at least one voltage source;
   pumping means for raising voltage level of one output terminal thereof;
   at least one switch circuit under control of a switch signal so that the voltage source controllably propagates to one output terminal of the switch circuit through the passing means; and
   means for forcing the output terminal of the pumping means and one internal node of the pumping means to an equal potential, so that the voltage source propagates to the output terminal of the switch circuit through said forcing means when the output terminal of the switch circuit is coupled to a ground.

2. The high-voltage switch circuit according to claim 1, further comprising a transistor with one terminal connected to the output terminal of the pumping means, and with another terminal connected to one input terminal of the switch circuit.

3. The high-voltage switch circuit according to claim 1, further providing at least a pair of clock signals inputting to the pumping means.

4. The high-voltage switch circuit according to claim 3, wherein said pumping means comprises a two-stage cascade pumping circuit.

5. The high-voltage switch circuit according to claim 4, wherein each stage of the two-stage cascade pumping circuit comprises:
   a capacitor configured to receive one of the clock signals; and
   a transistor coupled to the capacitor, two of three terminals of the transistor being connected.

6. The high-voltage switch circuit according to claim 1, wherein said output terminal of the switch circuit is coupled to a word line or a source line of a flash memory device.

7. The high-voltage switch circuit according to claim 1, wherein said capacitors of the two-stage cascade pumping circuit are electrically connected in parallel.

8. A high-voltage switch circuit, comprising:
   at least one voltage source input terminal for providing at least one voltage source;
   a passing circuit configured to controllably pass said at least one voltage source;
   a multi-stage cascade pumping circuit configured to raise voltage level of one output terminal thereof by at least a pair of clock signals inputting to the multi-stage cascade pumping circuit;
   at least one switch circuit under control of a switch signal so that the voltage source controllably propagates to one output terminal of the switch circuit through the passing circuit, wherein the output terminal of the switch circuit is coupled to a word line or a source line of a flash memory device; and
   an equalizing circuit configured to force the output terminal of the multi-stage cascade pumping circuit and one internal node of the multi-stage cascade pumping circuit to an equal potential, so that the voltage source propagates to the output terminal of the switch circuit through the equalizing circuit when the output terminal of the switch circuit is coupled to a ground.

9. The high-voltage switch circuit according to claim 8, further comprising a transistor with one terminal connected to the output terminal of the multi-stage cascade pumping circuit, and with another terminal connected to one input terminal of the switch circuit.

10. The high-voltage switch circuit according to claim 8, wherein each stage of the multi-stage cascade pumping circuit comprises:

a capacitor configured to receive one of the clock signals; and a transistor coupled to the capacitor, two of three terminals of the transistor being connected.

11. The high-voltage switch circuit according to claim 8, wherein said capacitors of the two-stage cascade pumping circuit are electrically connected in parallel.

* * * * *